(12) United States Patent
Sanghani et al.

(10) Patent No.: US 7,305,598 B1
(45) Date of Patent: Dec. 4, 2007

(54) TEST CLOCK GENERATION FOR HIGHER-SPEED TESTING OF A SEMICONDUCTOR DEVICE

(76) Inventors: Amit Sanghani, 3945 Carracci La., San Jose, CA (US) 95135; Philip Manela, 13235 McDole St., Saratoga, CA (US) 95070

( * ) Notice: Subject to any disclaimer, the term of this patent is extended or adjusted under 35 U.S.C. 154(b) by 305 days.

(21) Appl. No.: 11/089,994

(22) Filed: Mar. 25, 2005

(51) Int. Cl.
*G01R 31/28* (2006.01)

(52) U.S. Cl. .................. 714/724; 714/731; 714/744

(58) Field of Classification Search ............. 714/33, 714/744, 724, 731; 327/141; 716/16; 326/38; 702/75
See application file for complete search history.

(56) References Cited

U.S. PATENT DOCUMENTS

| | | | | |
|---|---|---|---|---|
| 5,453,993 A | * | 9/1995 | Kitaguchi et al. | 714/733 |
| 5,805,611 A | * | 9/1998 | McClure | 714/744 |
| 6,489,819 B1 | * | 12/2002 | Kono et al. | 327/141 |
| 6,817,006 B1 | * | 11/2004 | Wells et al. | 716/16 |
| 6,891,395 B2 | * | 5/2005 | Wells et al. | 326/38 |
| 6,904,375 B1 | * | 6/2005 | Sabih et al. | 702/75 |

* cited by examiner

*Primary Examiner*—David Ton
(74) *Attorney, Agent, or Firm*—Berkeley Law and Technology Group, LLP

(57) ABSTRACT

Embodiments for generating a higher frequency test clock signal for a semiconductor device are disclosed. In an example embodiment, a clock generator may be coupled to a clock input. A test clock generator may receive a clock signal generated by the clock generator, and the test clock generator may output a higher frequency test clock signal derived at least in part from the clock signal generated by the clock generator. The test clock generator may output the higher frequency test clock signal for a configurable number of clock periods.

22 Claims, 7 Drawing Sheets

Semiconductor Device 100

TEST CLOCK GENERATION FOR HIGHER-SPEED TESTING OF A SEMICONDUCTOR DEVICE

FIELD

This application pertains to the field of semiconductor devices, and more particularly, to the field of testing semiconductor devices.

BACKGROUND

Many semiconductor devices include circuitry intended to allow external testing equipment to cause testing procedures to occur within the semiconductor devices. External testing equipment may be coupled to a semiconductor device and may transmit and/or receive a variety of signals to and/or from the semiconductor device. Among the possible signals transmitted from the test equipment to the semiconductor device may be a clock signal and a test clock signal, as well as test data input and output signals.

During some testing procedures, it may be advantageous to cause the semiconductor device to operate at a clock frequency that may be approximately the frequency intended for use during normal full-speed operation of the semiconductor device. This may be accomplished by the testing equipment providing a full-speed clock signal to a semiconductor device clock input. The semiconductor device may also receive the test clock signal from the testing equipment at a test clock input. The test clock signal may be a slower frequency clock used to shift test data in and out of the semiconductor device.

Semiconductor device clock frequencies for normal full-speed operating conditions tend to increase over time, and now often exceed one Giga hertz. As these operating frequencies increase, it becomes more difficult and expensive to have test equipment provide full-speed clock signals during testing procedures.

BRIEF DESCRIPTION OF THE DRAWING

The claimed subject matter will be understood more fully from the detailed description given below and from the accompanying drawings of embodiments which should not be taken to limit the claimed subject matter to the specific embodiments described, but are for explanation and understanding only.

DETAILED DESCRIPTION

Figure 1:
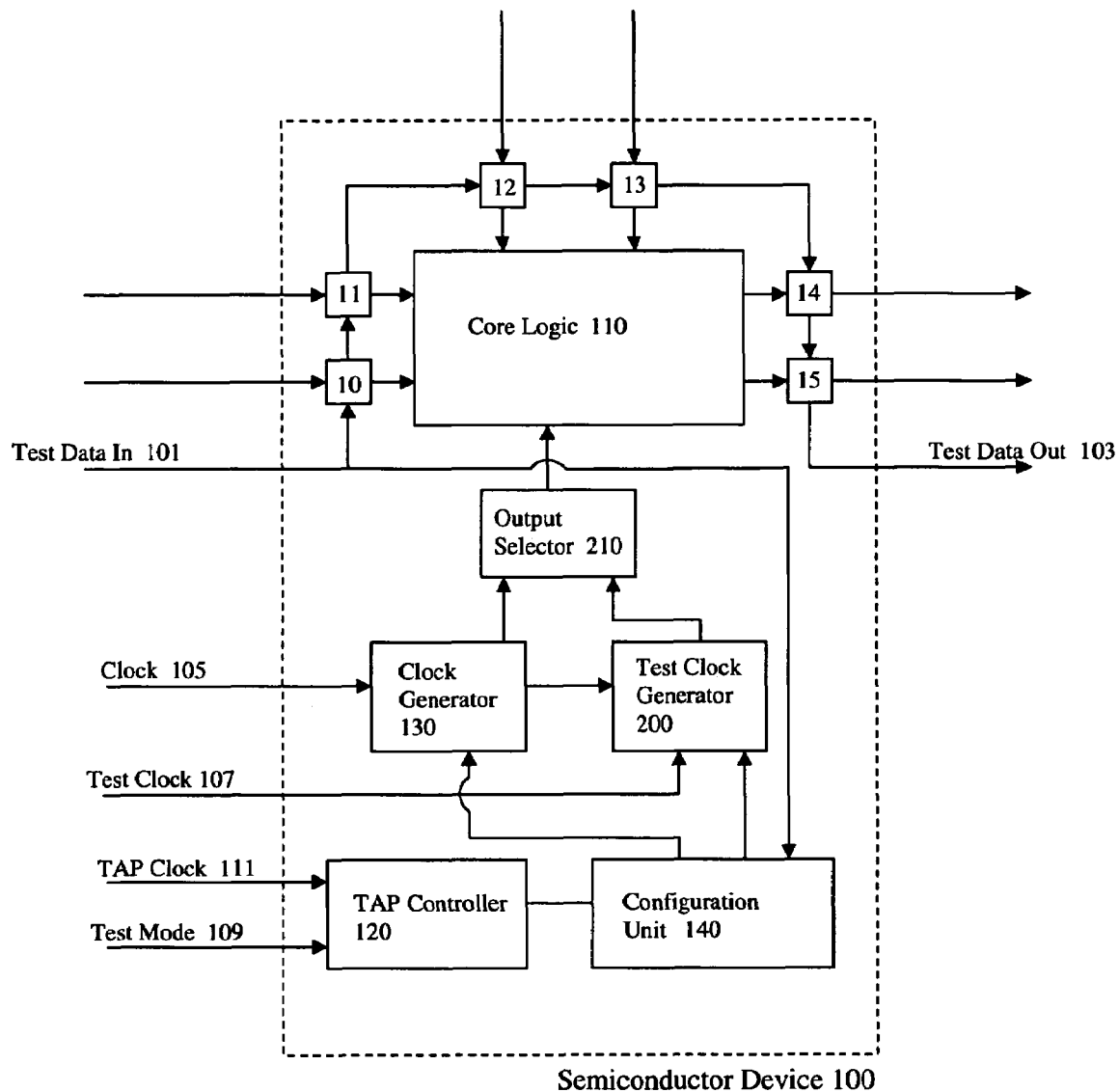
FIG. 1 is a block diagram of an example embodiment of a semiconductor device.

FIG. 1 is a block diagram of an example embodiment of a semiconductor device 100. Semiconductor device 100 includes a core logic 110. Core logic 110 may perform any of a wide range of functions. Core logic 110 may receive input signals from boundary cells 10, 11, 12, and 13, and may provide output signals to boundary cells 14 and 15. Although this example embodiment describes six boundary cells, other embodiments may include an increased amount of boundary cells. Boundary cells 10-15 may also form a scan chain that may be used to shift test data in and out of semiconductor device 100. Although FIG. 1 shows only boundary cells as part of the scan chain, other embodiments may also include cells within core logic 110 as part of the scan chain. Other embodiments may include internal cells but not boundary cells as part of a scan chain. Additionally, other embodiments may use test methods other than scan chains. A Test Data In signal 101 may provide test data to semiconductor device 100, and a Test Data Out signal 103 may output test data from semiconductor device 100. Test Data In 101 may be coupled to test equipment (not shown). The test equipment may provide test data to semiconductor device 100. Test Data Out 103 may also be coupled to test equipment, or may be coupled to another semiconductor device.

Semiconductor device 100 may also receive a Test Clock signal 107, a Test Mode signal 109, a Test Access Port (TAP) Clock signal 111 and a Clock signal 105 from test equipment. TAP Clock signal 111 and Test Mode signal 109 may be received by a TAP controller 120. Test Clock 107 may be received at a test clock generator 200. For one embodiment, TAP controller 120 and signals 101, 103, 107, 109, and 111 may adhere to the Institute of Electrical and Electronics Engineers (IEEE) Standard Test Access Port and Boundary Scan Architecture protocol (IEEE 1149.1).

TAP controller 120 may be coupled to a configuration unit 140. Configuration unit 140 may also receive information via the Test Data In signal 101. Configuration unit 140 may include registers and/or other circuitry to provide configuration information or signals to a clock generator 130 and test clock generator 200. Clock generator 130 also receives Clock signal 105. An output selector 210 selects a clock signal from either clock generator 130 or test clock generator 200 for delivery to core logic 110.

Testing operations within semiconductor device 100 may be divided into shift periods and capture periods. During shift periods, test data may be shifted into boundary cells 10-15 and/or internal cells and delivered to configuration unit 140 at a rate dictated by Test Clock 107. Also during shift periods, configuration unit 140 may communicate test information to test clock generator 200. During capture periods, core logic may be operated at a clock frequency greater than that of the Test Clock 107. Core logic 110 may be operated "at speed," meaning at a frequency within a normal operating range, according to a higher frequency test clock signal output by the test clock generator 200. The term "higher frequency test clock" is meant to denote a test clock with a frequency greater than that used during slower speed test operations, such as during shift periods. The higher frequency test clock may be derived from the clock signal generated by the clock generator 130. Clock generator 130 may comprise phase lock loop (PLL) circuitry, and may produce a clock that has a frequency that is a programmable integer or rational multiple of the frequency of Clock 105.

Figure 2:
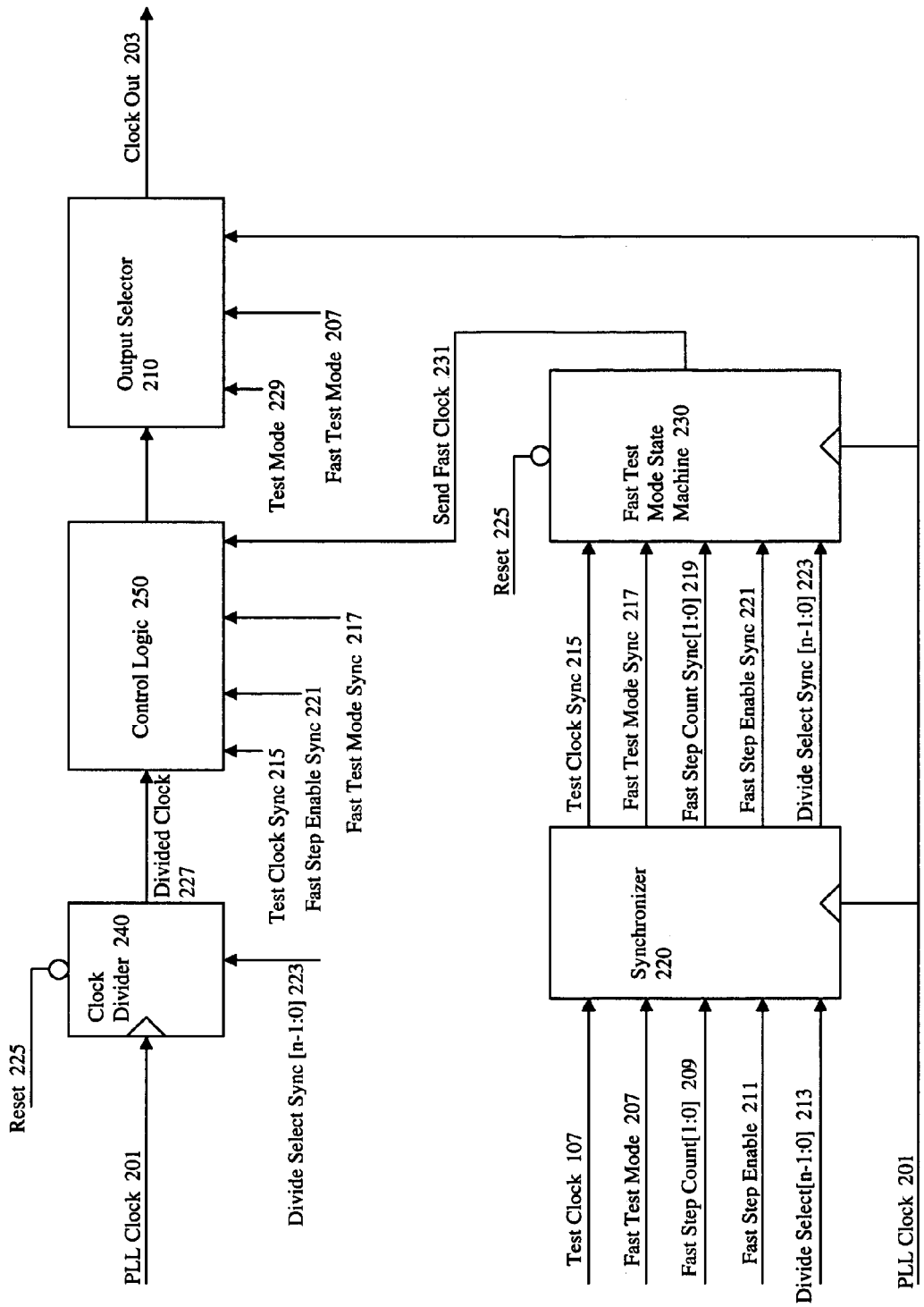
FIG. 2 is a block diagram of an example embodiment of a test clock generator.

FIG. 2 is a block diagram of an example embodiment of test clock generator 200 and output selector 210. Test clock generator 200 for this example embodiment includes a clock divider 240, a synchronizer 220, a control logic 250, and a fast test mode state machine 230. Other embodiments are possible using other configurations.

Synchronizer 220 may receive Test Clock 107, a Fast Test Mode signal 207, Fast Step Count[1:0] signals 209, a Fast Step Enable signal 211, and Divide Select[n−1:0] signals 213. Fast Test Mode 207, Fast Step Count[1:0] 209, Fast Step Enable 211, and Divide Select[n−1:0] 213 for this example embodiment may be received from configuration unit 140.

Synchronizer 220 also receives a PLL Clock signal 201, which for this embodiment may be generated by clock generator 130. Synchronizer 220 may serve to synchronize the received signals by latching in received signals at a rate determined by PLL Clock 201. Synchronizer 220 outputs synchronized signals Test Clock Sync 215 which is a synchronized version of Test Clock 107, Fast Test Mode Sync 217 which is a synchronized version of Fast Test Mode 207, Fast Step Count Sync[1:0] 219 which are synchronized versions of Fast Step Count[1:0] 209, Fast Step Enable Sync 221 which is a synchronized version of Fast Step Enable 211, and Divide Select Sync[n−1:0] 223 which are synchronized versions of Divide Select[n−1:0] 213.

Clock divider 240 receives a PLL Clock signal 201. Clock divider 240 may also receive a Divide Select Sync [n−1:0] signal 223. Divide Select[n−1:0] 213 may provide a factor by which clock divider 240 is to divide the frequency of PLL Clock 201 to produce a Divided Clock signal 227.

Fast Test Mode State Machine 230 receives Test Clock Sync 215, Fast Test Mode Sync 217, Fast Step Count Sync[1:0] 219, Fast Step Enable Sync 221, Divide Select Sync[n−1:0] 223, and PLL Clock 201. Fast Test Mode State Machine 230 monitors the input signals and determines when to assert a Send Fast Clock signal 231 to control logic 250. The function of Fast Test Mode State Machine 230 may be better understood by viewing Table 1 below and FIG. 3 which are discussed below.

Control logic 250 receives Divided Clock 227 from clock divider 240. Control logic 250 also receives Test Clock Sync 215, Fast Step Enable Sync 221, Fast Test Mode Sync 217, and Send Fast Clock 231. Control logic 250 for this example embodiment delivers either Divided Clock 227 or Test Clock Sync 215 to output selector 210, depending on the states of Fast Step Enable Sync 221, Fast Test Mode Sync 217, and Send Fast Clock 231. For this embodiment, if Fast Step Enable Sync 221, Fast Test Mode Sync 217, and Send Fast Clock 231 are asserted, control logic 250 delivers Divided Clock 227 to output selector 210. If Send Fast Clock 231 is not asserted, control logic 250 delivers Test Clock Sync 215 to output selector 210.

For this embodiment, if Test Mode 229 or Fast Test Mode 207 are asserted, output selector 210 delivers the clock signal delivered by control logic 250 to Clock Out signal 203. If both Test Mode 229 and Fast Test Mode 207 are not enabled, output selector 210 delivers PLL Clock 201 to Clock Out 203.

Table 1 summarizes some of the functions of this example embodiment.

TABLE 1

| Mode | Test Mode 229 | Fast Test Mode 207 | Test Clock 107 | Clock 105 | Fast Step Enable 211 |
| --- | --- | --- | --- | --- | --- |
| Normal | 0 | 0 | X | Pulse | 0 |
| Scan | 1 | 0 | Pulse | 0 | 0 |
| Fast Test | 1 | 1 | Pulse = CNT | Pulse | Switch |

Table 1 shows that for this example embodiment, when semiconductor device 100 is in normal (non-test) mode Test Mode 229, Fast Test Mode 207, and Fast Step Enable 211 are not asserted. Test Clock 107 serves no function in normal mode. Clock 105 is used by clock generator 130 to generate an at-speed clock for core logic 110. For a Scan mode (lower speed test operation), Test Mode 220 is asserted, but Fast Test Mode 207 and Fast Step Enable 211 are not asserted. Test Clock 107 is used to shift test data into and out of semiconductor device 100 and to provide a clock for core logic 110. Clock 105 serves no function in Scan mode. For Fast Test Mode, Test Mode 229 and Fast Test Mode 207 are asserted. Clock 105 is used to generate PLL Clock 201 which is in turn used to produce Divided Clock 227. Fast Step Enable 211 may be used to cause control logic 250 to enter a state where upon an assertion of Send Fast Clock 231 control logic 250 outputs a number of periods of Divided Clock 227 to output selector 210. The number of periods of Divided Clock 227 to output may be determined by a value indicated by Fast Step Count[1:0] 209. The value of Fast Step Count[1:0] 209 may also indicate to Fast Test Mode State Machine 230 a number of Test Clock Sync 215 pulses to count in response to an assertion of Fast Step Enable Sync 221 before asserting Send Fast Clock 231. Although this embodiment uses a two bit width for Fast Step Count 209, other embodiments may use other numbers of bits.

Figure 3:
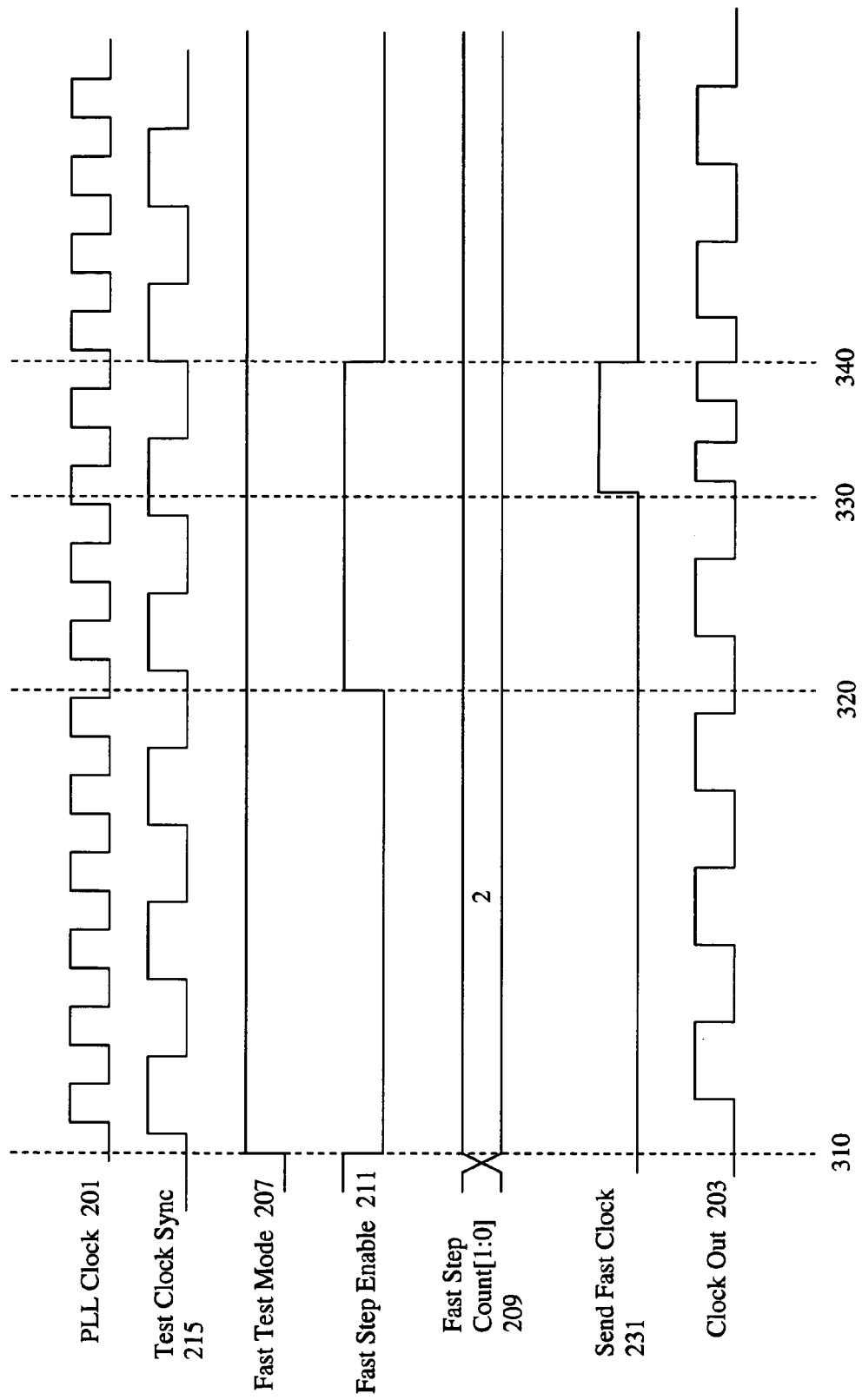
FIG. 3 is a timing diagram illustrating an example test clock generation operation.

FIG. 3 is a timing diagram illustrating an example test clock generation operation. The diagram shown in FIG. 3 is not shown to scale, and is merely intended to illustrate an example test clock generation operation. Embodiments may use signal timings and relationships that vary from those shown in FIG. 3.

At time 310, Fast Test Mode 207 is asserted and Fast Step Enable 211 is not asserted, indicating a shift period. Fast Step Count[1:0] 209 for this example indicates a count value of two. This count value is used to indicate the number of higher frequency test clock pulses that will be output upon an assertion of Send Fast Clock 231, and also indicates to Fast Test Mode State Machine 230 how many rising edges of Test Clock Sync 215 to count after assertion of Fast Step Enable 211 before asserting Send Fast Clock 231.

At time 320, Fast Step Enable 211 becomes asserted, indicating the beginning of a capture period. In response to the assertion of Fast Step Enable 211, Fast Test Mode State Machine 230 begins to count rising edges of Test Clock Sync 215. At time 330, in response to the second rising edge of Test Clock Sync 215 following the assertion of Fast Step Enable 211, Send Fast Clock 231 is enabled, and control logic 250 causes the output of two periods of Divided Clock 227 to output selector 210. Output selector 210 passes the two periods of Divided Clock 227 onto Clock Out 203.

At time 340, Send Fast Clock 231 and Fast Step Enable 211 are deasserted, indicating the end of the capture period and the beginning of a new shift period. Control logic 250 begins again to deliver Test Clock Sync 215 to output selector 210.

Figure 4:
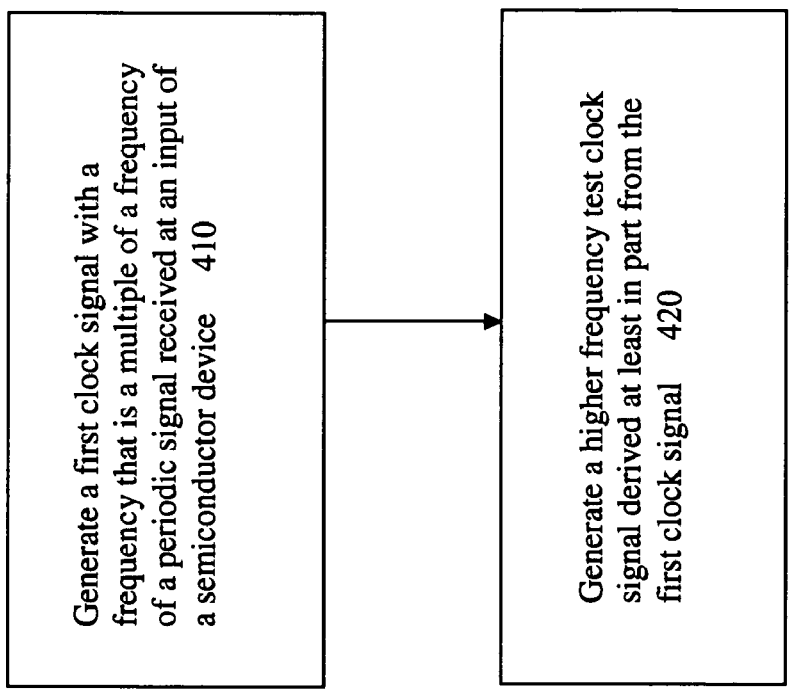
FIG. 4 is a flow diagram of an example embodiment of a method for generating a test clock.

FIG. 4 is a flow diagram of an example embodiment of a method for generating a test clock. At block 410, a first clock signal with a frequency that is an integer or rational multiple of a frequency of a periodic signal received at an input of a semiconductor device is generated. At block 420, a higher frequency test clock signal derived at least in part from the first clock signal is generated. This example embodiment may be implemented according to the embodiments discussed above in connection with FIGS. 1-3 and/or FIGS. 5-6 below. Other embodiments are possible.

Figure 5:
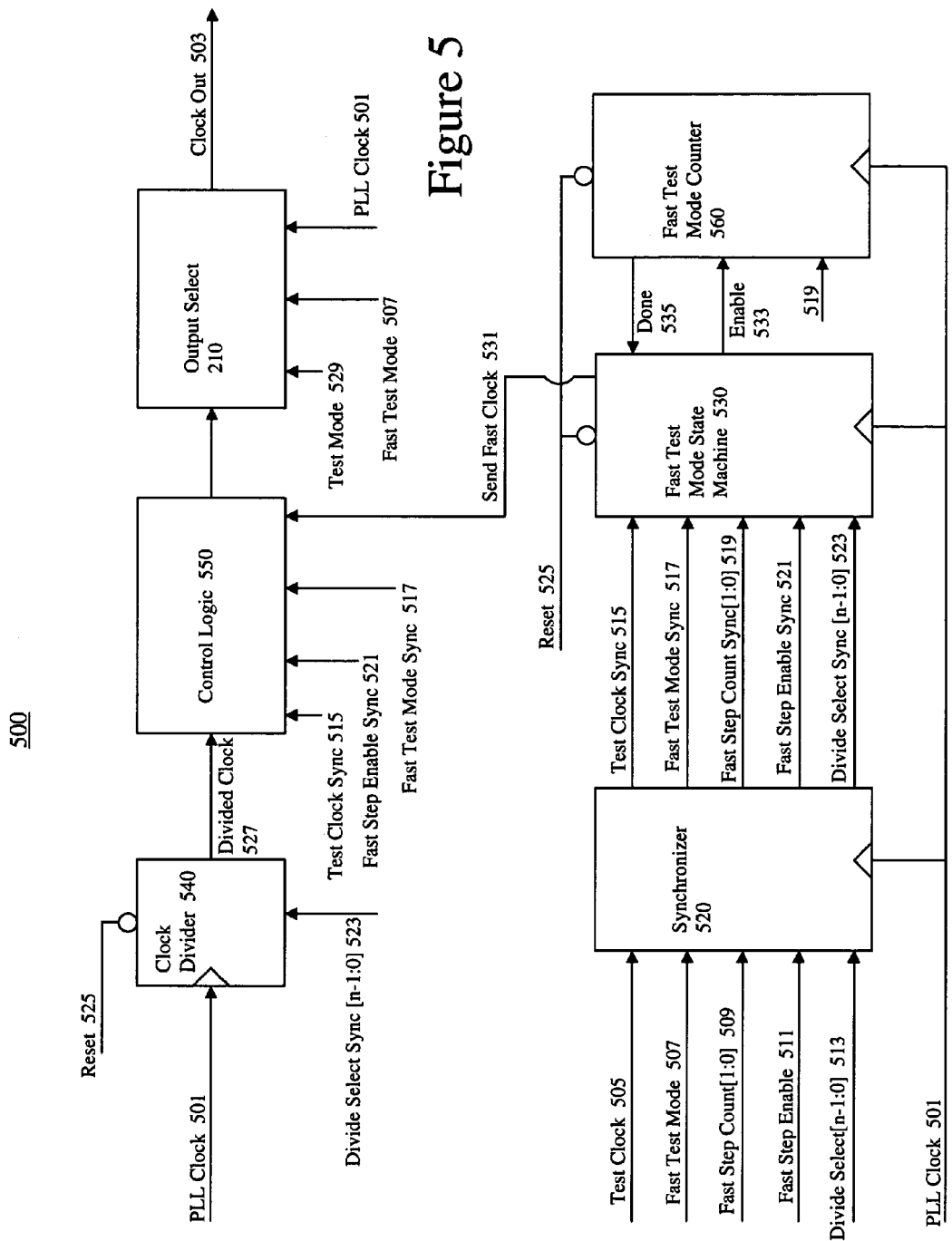
FIG. 5 is a block diagram of an example embodiment of a test clock generator.

FIG. 5 is a block diagram of an example embodiment of a test clock generator 500 and output selector 210. In one embodiment, test clock generator 500 may be used in place of test clock generator 200 shown in FIG. 1. Test clock generator 500 for this example embodiment includes a clock divider 540, a synchronizer 520, a control logic 550, a fast test mode state machine 530, and a fast test mode counter 560. Other embodiments are possible using other configurations.

Synchronizer 520 may receive a Test Clock 505, a Fast Test Mode signal 507, Fast Step Count[1:0] signals 509, a Fast Step Enable signal 511, and Divide Select[n−1:0] signals 513. Fast Test Mode 507, Fast Step Count[1:0] 509, Fast Step Enable 511, and Divide Select[n−1:0] 513 for this example embodiment may be received from configuration unit 140. Test Clock 505 may correspond to Test Clock 107.

Synchronizer 520 also receives a PLL Clock signal 501, which for this embodiment may be generated by clock generator 130. Synchronizer 520 may serve to synchronize the received signals by latching in received signals at a rate determined by PLL Clock 501. Synchronizer 520 outputs synchronized signals Test Clock Sync 515 which is a synchronized version of Test Clock 505, Fast Test Mode Sync 517 which is a synchronized version of Fast Test Mode 507, Fast Step Count Sync[1:0] 519 which are synchronized versions of Fast Step Count[1:0] 509, Fast Step Enable Sync 521 which is a synchronized version of Fast Step Enable 511, and Divide Select Sync[n−1:0] 523 which are synchronized versions of Divide Select[n−1:0] 513.

Clock divider 540 receives PLL Clock 501, and may also receive a Divide Select Sync [n−1:0] signal 523. Divide Select[n−1:0] 513 may provide a programmable factor by which clock divider 540 is to divide the frequency of PLL Clock 501 to produce a Divided Clock signal 527.

Fast Test Mode State Machine 530 receives Test Clock Sync 515, Fast Test Mode Sync 517, Fast Step Count Sync[1:0] 519, Fast Step Enable Sync 521, Divide Select Sync[n−1:0] 523, and PLL Clock 501. Fast Test Mode State Machine 530 monitors the input signals and determines when to assert a Send Fast Clock signal 531 to control logic 550.

In the embodiment discussed above in connection with FIG. 2, Fast Step Count[1:0] was used to communicate a count value that indicated a number of higher frequency test clock periods to output during the capture period. For the embodiment being discussed in connection with FIG. 5, Fast Step Count[1:0] 509 may communicate an encoded value that indicates the length of a count window during which the number of Test Clock Sync 515 pulses are counted. The length of the count window may be determined in one embodiment by a number of PLL Clock 501 periods indicated by the encoded value on Fast Step Count[1:0] 509.

For example, a value of two on Fast Step Count[1:0] 509 may indicate a count window of 64 PLL Clock 501 periods. Fast test mode counter 560 may be used to count the number of PLL Clock 501 periods indicated by Fast Step Count Synch[1:0] 519. Fast Test Mode Counter 560 begins counting upon an assertion of Enable signal 533, and indicates that the appropriate number of PLL Clock 501 periods have occurred by asserting a Done signal 535. During the count window, Fast Test Mode State Machine 530 counts the number of Test Clock Sync 515 pulses. The amount of Test Clock Sync 515 pulses occurring during the count window determines the number of higher frequency test clock periods to output during the next capture period. This function provides for dynamic modulation of the number of higher frequency test clock pulses to be applied during capture periods.

For this example embodiment, a value of 00b on Fast Step Count[1:0] 509 indicates a count window of 16 PLL Clock 501 periods. A value of 01b on Fast Step Count[1:0] 509 indicates a count window of 32 PLL Clock 501 periods. A value of 10b on Fast Step Count[1:0] 509 indicates a count window of 64 PLL Clock 501 periods. A value of 11b on Fast Step Count[1:0] 509 indicates a count window of 128 PLL Clock 501 periods. Although this embodiment uses a two bit width for Fast Step Count 509, other embodiments may encode the count window value using other numbers of bits.

The function of Fast Test Mode State Machine 530 and Fast Test Mode Counter 560 may be better understood by viewing Table 2 below and FIG. 6 which are discussed below.

Control logic 550 receives Divided Clock 527 from clock divider 540. Control logic 550 also receives Test Clock Sync 515, Fast Step Enable Sync 521, Fast Test Mode Sync 517, and Send Fast Clock 531. Control logic 550 for this example embodiment delivers either Divided Clock 527 or Test Clock Sync 515 to output selector 210, depending on the states of Fast Step Enable Sync 521, Fast Test Mode Sync 517, and Send Fast Clock 531. For this embodiment, if Fast Step Enable Sync 521, Fast Test Mode Sync 517, and Send Fast Clock 531 are asserted, control logic 550 delivers Divided Clock 527 to output selector 210. If Send Fast Clock 531 is not asserted, control logic 550 delivers Test Clock Sync 515 to output selector 210.

For this embodiment, if Test Mode 529 or Fast Test Mode 507 are asserted, then output selector 210 delivers the clock signal delivered by control logic 550 to Clock Out signal 503. If both Test Mode 529 and Fast Test Mode 507 are not enabled, output selector 210 delivers PLL Clock 501 to Clock Out 503.

Table 2 summarizes some of the functions of this example embodiment.

TABLE 2

| Mode | Test Mode 529 | Fast Test Mode 507 | Test Clock 505 | Clock 105 | Fast Step Enable 511 |
|---|---|---|---|---|---|
| Normal | 0 | 0 | X | Pulse | 0 |
| Scan | 1 | 0 | Pulse | 0 | 0 |
| Fast Test | 1 | 1 | Pulse = Variable | Pulse | Switch |

Table 2 shows that for this example embodiment, when semiconductor device 100 is in normal (non-test) mode Test Mode 529, Fast Test Mode 507, and Fast Step Enable 511 are not asserted. Test Clock 505 serves no function in normal mode. Clock 105 is used by clock generator 130 to generate an at-speed clock for core logic 110. For a Scan mode (lower speed test operation), Test Mode 520 is asserted, but Fast Test Mode 507 and Fast Step Enable 511 are not asserted. Test Clock 505 is used to shift test data into and out of semiconductor device 100 and to provide a clock for core logic 110. Clock 105 serves no function in Scan mode. For Fast Test Mode, Test Mode 529 and Fast Test Mode 507 are asserted. Clock 105 is used to generate PLL Clock 501 which is in turn used to produce Divided Clock 527. Fast Step Enable 511 may be used to cause control logic 550 to enter a state where upon an assertion of Send Fast Clock 531 control logic 550 outputs a number of periods of Divided Clock 527 to output selector 210. The number of periods of Divided Clock 527 to output may be determined by a number of Test Clock 505 pulses occurring during a count window. The length of the count window may be determined by a value indicated by Fast Step Count[1:0] 509.

Figure 6:
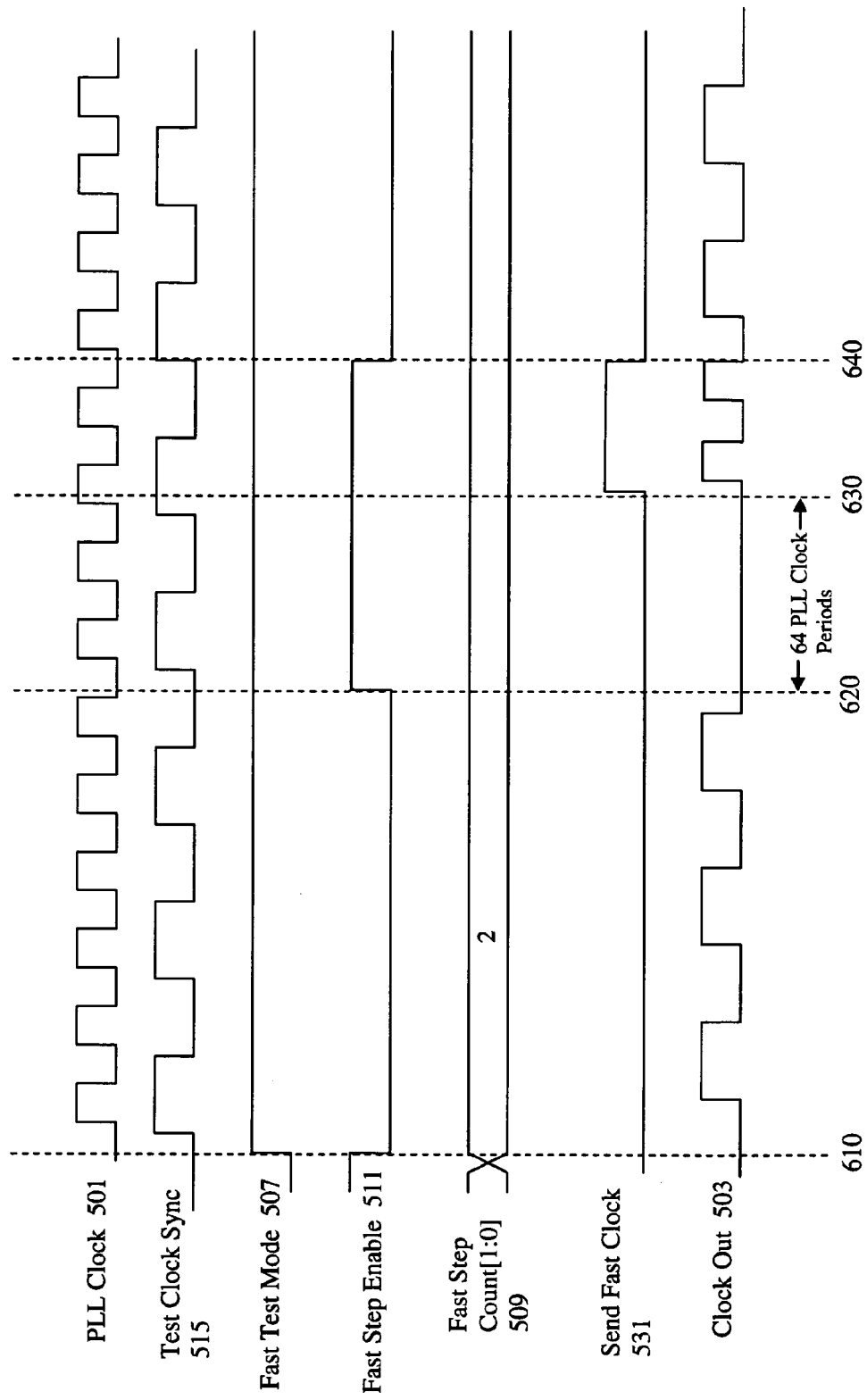
FIG. 6 is a timing diagram illustrating an example test clock generation operation.

FIG. 6 is a timing diagram illustrating an example test clock generation operation. The diagram shown in FIG. 6 is not shown to scale, and is merely intended to illustrate an example test clock generation operation. In particular, note that PLL Clock 501 is not drawn to scale. In most embodiments, PLL Clock 501 would have a period much smaller than that of Test Clock Sync 515. Embodiments may use signal timings and relationships that vary from those shown in FIG. 6.

At time 610, Fast Test Mode 507 is asserted and Fast Step Enable 511 is not asserted, indicating a shift period. Fast Step Count[1:0] 509 for this example indicates a count value of two, which denotes a count window of 64 PLL Clock 501 periods.

At time 620, Fast Step Enable 511 becomes asserted, indicating the beginning of a capture period. In response to the assertion of Fast Step Enable 511, Fast Test Mode Counter 560 begins counting PLL Clock 501 periods, and Fast Test Mode State Machine 530 begins to count pulses of Test Clock Sync 515. For this example, during the count window of 64 PLL Clock 501 periods between times 620 and 630, two Test Clock Sync 515 pulses occur. Therefore, two higher frequency test clock periods will be output during assertion of Send Fast Clock 531. At time 630, in response to the end of the count window indicated by an assertion of Done 535, Send Fast Clock 531 is asserted long enough to allow control logic 550 to cause the output of two periods of Divided Clock 527 to output selector 210. Output selector 210 passes the two periods of Divided Clock 527 onto Clock Out 503.

At time 640, Send Fast Clock 531 and Fast Step Enable 511 are deasserted, indicating the end of the capture period and the beginning of a new shift period. Control logic 550 begins again to deliver Test Clock Sync 515 to output selector 210.

Figure 7:
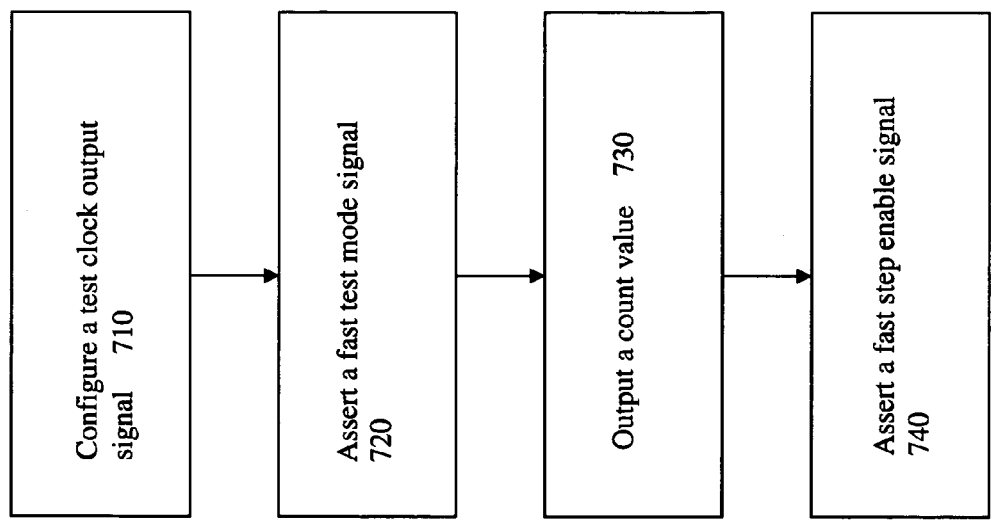
FIG. 7 is a flow diagram of an example embodiment of a method for causing a semiconductor device to generate a test clock.

FIG. 7 is a flow diagram of an example embodiment of a method for causing a semiconductor device to generate a test clock. In one embodiment, the method may be performed by test equipment executing instructions stored on a machine-readable medium. At block 710, a test clock output signal is configured. The test clock output signal may be coupled to a semiconductor device. At block 720, a Fast Test Mode signal is asserted. This may be accomplished by test equipment delivering an instruction or other information to the semiconductor device to cause the semiconductor device to assert the signal. A count value is output to the semiconductor device at block 730. The count value may have the attributes of the Fast Step Count values discussed above in connection with FIGS. 2-6. At block 740, a Fast Step Enable signal is asserted. This may be accomplished by test equipment delivering an instruction or other information to the semiconductor device to cause the semiconductor device to assert the signal.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments.

In the foregoing specification claimed subject matter has been described with reference to specific example embodiments thereof. It will, however, be evident that various modifications and/or changes may be made thereto without departing from the broader spirit and/or scope of the subject matter as set forth in the appended claims. The specification and/or drawings are, accordingly, to be regarded in an illustrative rather than in a restrictive sense.

What is claimed is:

1. An apparatus, comprising:
a clock generator coupled to a clock input signal; and
a test clock generator to receive a clock signal generated by the clock generator, the test clock generator to generate a higher frequency test clock signal derived at least in part from the clock signal generated by the clock generator, the test clock generator to generate the higher frequency test clock signal for a configurable number of clock periods.

2. The apparatus of claim 1, the test clock generator to generate the higher frequency test clock signal during a capture period.

3. The apparatus of claim 2, further comprising a test clock input signal coupled to the test clock generator.

4. The apparatus of claim 3, the test clock generator to produce a lower frequency test clock signal during a shift period, the lower frequency test clock signal derived at least in part from a test clock signal received via the test clock input signal.

5. The apparatus of claim 4, the test clock generator to generate the higher frequency test clock signal for a number of clock periods determined by a count value received by the test clock generator.

6. The apparatus of claim 4, the test clock generator to generate the higher frequency test clock signal for a number of clock periods determined by counting the number of periods of the test clock signal received during a specified period of time.

7. The apparatus of claim 6, the specified period of time comprising a programmable number of periods of the clock signal generated by the clock generator.

8. The apparatus of claim 1, the clock generator including a phase locked loop circuit.

9. The apparatus of claim 1, the clock generator to generate a clock signal with a frequency that is a programmable multiple of a frequency of a periodic signal received via the clock input signal.

10. A method, comprising:
generating a first clock signal with a frequency that is a multiple of a frequency of a periodic signal received at an input signal of a semiconductor device;
generating a higher frequency test clock signal derived at least in part from the first clock signal; and
generating the higher frequency test clock signal for a configurable number of clock periods.

11. The method of claim 10, wherein said generating the higher frequency test clock signal comprises generating the higher frequency test clock signal during a capture period.

12. The method of claim 11, further comprising receiving a test clock signal via a test clock input signal.

13. The method of claim 12, further comprising producing a lower frequency test clock signal during a shift period, the lower frequency test clock signal being derived at least in part from the test clock signal received via the test clock input signal.

14. The method of claim 13, further comprising receiving a count value and further wherein said generating the higher frequency test clock signal comprises generating the higher frequency test clock signal for a configurable number of clock periods, the configurable number of clock periods determined by the received count value.

15. The method of claim 13, further comprising counting a number of periods of the test clock signal received during a specified period of time, the specified period of time comprising a programmable number of periods of the first clock signal and further wherein said generating the higher frequency test clock signal comprises generating the higher frequency test clock signal for a number of clock periods determined by counting the number of periods of the test clock signal received during the specified period of time.

16. A method, comprising:
   transmitting a test clock signal to a semiconductor device to be tested;
   asserting a fast test mode signal to the semiconductor device to cause, at least in part the semiconductor device to enter a shift mode;
   transmitting a count value to the semiconductor device; and
   asserting a fast step enable signal to the semiconductor device to cause, at least in part, the semiconductor device to generate a higher frequency test clock signal for a configurable number of clock cycles during a capture period.

17. The method of claim 16, wherein said transmitting the count value comprises transmitting a count value that represents a number of higher frequency test clock periods to be generated during the capture period.

18. The method of claim 16, wherein said transmitting the count value comprises transmitting a count value that represents a period of time during which a number of periods of the test clock signal are counted to determine a number of higher frequency test clock periods to be generated during the capture period.

19. An article comprising:
   a storage medium having stored thereon instructions, that, if executed, result in:
   transmitting a test clock signal to a semiconductor device to be tested;
   asserting a fast test mode signal to the semiconductor device to cause, at least in part, the semiconductor device to enter a shift mode;
   transmitting a count value to the semiconductor device; and
   asserting a fast step enable signal to the semiconductor device to cause, at least in part, the semiconductor device to generate a higher frequency test clock signal for a configurable number of clock cycles during a capture period.

20. The article of claim 19, wherein said transmitting the count value comprises transmitting a count value that represents a number of higher frequency test clock periods to be generated during the capture period.

21. The article of claim 19, wherein said transmitting the count value comprises transmitting a count value that represents a period of time during which a number of periods of the test clock signal are counted to determine a number of higher frequency test clock periods to be generated during the capture period.

22. An apparatus, comprising:
   means for generating a clock signal coupled to means for receiving a clock input signal; and
   means for generating a test clock signal to receive the clock signal generated by the means for generating a clock signal, the means for generating a test clock signal to generate a higher frequency test clock signal derived at least in part from the clock signal generated by the means for generating a clock signal, the means for generating a test clock signal to generate the higher frequency test clock signal for a configurable number of clock periods during a capture period.

* * * * *